United States Patent
Cho et al.

(10) Patent No.: US 10,506,707 B2
(45) Date of Patent: Dec. 10, 2019

(54) FLEXIBLE DISPLAY DEVICE

(71) Applicant: LMS CO., LTD, Pyeongtaek-si, Gyeonggi-do (KR)

(72) Inventors: Jang Hee Cho, Suwon-si (KR); Chang Hyo Lee, Seoul (KR); Sung Sik Cho, Suwon-si (KR); Yong Il Kim, Seongnam-si (KR); Joon Hwan Hwang, Seoul (KR)

(73) Assignee: LMS CO., LTD, Pyeongtaek-si, Gyeonggi-Do (KR)

( * ) Notice: Subject to any disclaimer, the term of this patent is extended or adjusted under 35 U.S.C. 154(b) by 0 days.

(21) Appl. No.: 14/772,447

(22) PCT Filed: Mar. 3, 2014

(86) PCT No.: PCT/KR2014/001716
§ 371 (c)(1),
(2) Date: Sep. 3, 2015

(87) PCT Pub. No.: WO2014/137113
PCT Pub. Date: Sep. 12, 2014

(65) Prior Publication Data
US 2016/0014883 A1    Jan. 14, 2016

(30) Foreign Application Priority Data
Mar. 4, 2013    (KR) .......................... 10-2013-0022796

(51) Int. Cl.
*H05K 1/02* (2006.01)
*H05K 1/18* (2006.01)

(52) U.S. Cl.
CPC ............. *H05K 1/028* (2013.01); *H05K 1/181* (2013.01); *H05K 1/02* (2013.01); *H05K 1/18* (2013.01); *H05K 2201/10128* (2013.01)

(58) Field of Classification Search
CPC combination set(s) only.
See application file for complete search history.

(56) References Cited

U.S. PATENT DOCUMENTS

| 2008/0055831 A1* | 3/2008 | Satoh | ............... G02F 1/133305 361/600 |
| 2013/0038820 A1* | 2/2013 | Chen | ..................... G06F 1/1652 349/86 |

FOREIGN PATENT DOCUMENTS

| JP | 2003-019745 A | 1/2003 |
| JP | 2009-170173 A | 7/2009 |

(Continued)

OTHER PUBLICATIONS

International Search Report for PCT/KR2014/001716 dated May 21, 2014 from Korean Intellectual Property Office.

*Primary Examiner* — Anthony J Frost
(74) *Attorney, Agent, or Firm* — Hauptman Ham, LLP

(57) ABSTRACT

A flexible display device including; a base film; a display sheet formed over the base film; and a structural pattern formed below the base film for moving a neutral plane with respect to a bending stress applied to the display sheet to a layer having relatively low rupture point among the layers consisting of the display sheet. The neutral plane is moved to a layer having a relative low rupture point in a flexible display device by forming the structural patterns so that the bending stress applying to the layer having a relative low rupture point can be minimized.

2 Claims, 4 Drawing Sheets

(56) References Cited

FOREIGN PATENT DOCUMENTS

JP             2009170173 A  *  7/2009
KR    10-2011-0012432 A       2/2011

* cited by examiner (A)   (B)   (C)

FLEXIBLE DISPLAY DEVICE

CROSS REFERENCE TO PRIOR APPLICATION

This application is a National Stage Patent Application of PCT International Patent Application No. PCT/KR2014/001716 (filed on Mar. 3, 2014) under 35 U.S.C. § 371, which claims priority to Korean Patent Application No. 10-2013-0022796 (filed on Mar. 4, 2013), which are all hereby incorporated by reference in their entirety.

TECHNICAL FIELD

The present invention relates to a display device and more particularly, to a flexible display device that ensures the structural flexibility.

BACKGROUND ART

Recently, it has entered into a ubiquitous period where information can be approached at anytime and anywhere, and a digital convergence proceeds rapidly, in which computer, telecommunication and information are blended or fixed to electrics-electronics. As a result, the importance of the display becomes greater, which serves as an interface between electronics-information utility and human beings.

Upon reviewing the current status of development of the display, a light-weighted, thin and flat Liquid Crystal Display (LCD) that reduces eye fatigue has already been widely used instead of a large-sized and heavy Cathode-Ray Tube (CRT). Further, Organic Light Emitting Display (OLED) has also been developed, which is lighter and thinner than LCD, and can vividly display more rapid mobile images than LCD. Furthermore, a study for developing a flexible display device that is thinner, lighter and unbroken is continuing by manufacturing the display on a flexible substrate using polymer film instead of glass substrate.

A flexible display device is a flat display that is manufactured on a flexible substrate that is bendable, and since the flexible display device is foldable, bendable or deformed into a roll shape while having excellent displaying characteristics, it is evaluated as a next generation technology at a current flat plate display market and thus various studies thereon are being made globally.

A flexible display device uses basically a flat plate display that is foldable, bendable or rollable within several centimeters like paper, and thus is light in weight, thin, superior in impact-resistance and freely bondable, unlike the existing display that uses a rigid glass substrate.

The flexible display device can be prepared in the shape of a wearable display, an electronic book, an electronic paper or the like, and the application range thereof is very wide so that it can be applied to a display product of various shapes.

Here, a bending stress is applied to a display sheet of the flexible display device due to a bending force, wherein when the bending stress is intensively applied to a layer that is easily ruptured by the bending stress among the stacked structure constituting the display sheet, or the bending stress is concentrated on a bonding portion between layers, damages such as crack or peeling-off may occur on the display sheet. In this case, the basic function of the flexible display device as a display device cannot be maintained at all.

DISCLOSURE

Technical Problem

The present invention has been proposed to solve the above problems and an object of the present invention is to provide a flexible display device that is proper for minimizing the damage to a display sheet by dispersing a bending stress generated by a bending force applied thereto.

Technical Solution

A flexible display device according to an aspect of the present invention in order to achieve the above object, including: a base film; a display sheet formed over the base film; and a structural pattern formed below the base film for moving a neutral plane with respect to a bending stress applied to the display sheet to a layer having relatively low rupture point among the layers constituting the display sheet.

It is preferable that the flexible display device further includes an adhering layer formed between the base film and the display sheet for bonding the base film and the display sheet.

It is preferable that the display sheet includes at least one of organic light emitting film and a protective film, and the structural pattern may move the neutral plane where the bending stress is zero to the layer that is ruptured easily among the plurality of layer constituting the display sheet.

It is preferable that the structural pattern includes a plurality of patterns in prism shapes, which are formed below the base film.

It is preferable that the structural pattern includes a plurality of patterns in pyramid shapes, which are formed below the base film.

It is preferable that the structural pattern includes a plurality of patterns in semi-circle column shapes, which are formed below the base film.

It is preferable that the structural pattern includes a plurality of patterns in hemisphere shapes, which are formed below the base film.

It is preferable that the plurality of patterns are arranged to be spaced at a predetermined distance.

It should be understood that different embodiments of the invention, including those described under different aspects of the invention, are meant to be generally applicable to all aspects of the invention. Any embodiment may be combined with any other embodiment unless inappropriate. All examples are illustrative and non-limiting.

Advantageous Effects

According to the present invention, since the neutral plane where a bending stress is zero is moved to a layer that is ruptured easily by the bending stress among a plurality of layers constituting a display sheet by the structural patterns formed below a base film, it can prevent crack or peeling off that occurs within a display panel.

That is, the structural patterns according to the present invention are further formed below the base film so that the damage to the display panel is inhibited thereby to improve durability thereof and further maximize the bending stress of a flexible display device.

BEST MODE FOR THE INVENTION

Figure 1:
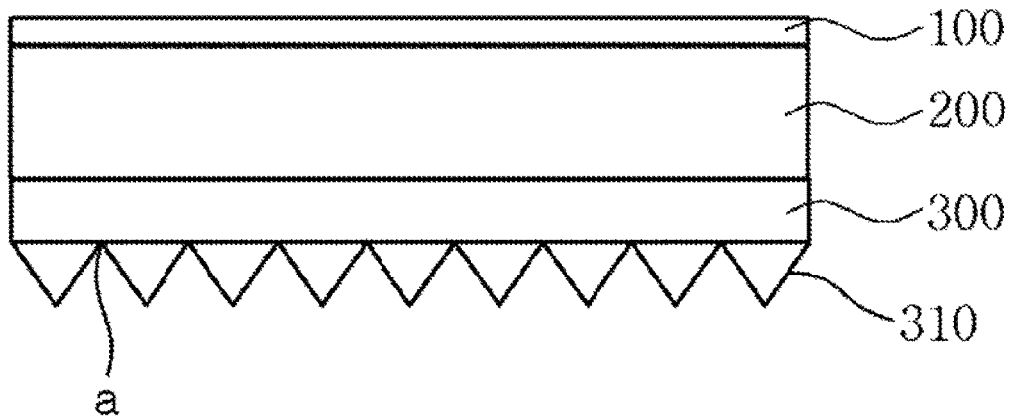
FIG. 1 is a cross-sectional view showing a stack structure of a flexible display device according to a first embodiment of the present invention.

Exemplary embodiments of a flexible display device according to the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the present invention the term of "flexible" shall be understood in the same meaning as the terms "foldable" and "bendable", wherein it means the ability of material, structure, device or constitutional element of device deformed in a curved shape without inducing significant deformation and rupture of the material, structure, device or constitutional element of device.

The term of "rupture point" is defined as the value of the bending stress at a starting point of a rupture of the device due to the significant deformation thereof. That is, the rupture point means a minimum stress value at which the rupture of the device starts when the deformation is given to the device.

The terms "layer", "sheet" and "film" shall be understood as having the same meaning, and the term "stack" means a structural phenomenon where two arbitrary layers are coupled in various ways such as deposit, adhesion, bonding or the like.

The term "constitutional element" means material used for the display device or respective constitutional elements thereof.

The term "bending moment" means external force applied when a deformation is given to the display sheet, and it means that the bending stress is applied to the display sheet by the bending moment.

The term "neutral plane" means a face on which stress is not produced when the bending stress is applied to a display sheet by the bending moment, that is, the face on which the bending stress is zero.

The term "bending configuration" means a structure having a bending shape that is made by external force. The bending configuration in the present invention may be a folded region, a bulging region, a sink region and a combination of one or more thereof. The useful bending configuration in the present invention may be, for example, a coil shape, a wrinkled shape, a buckling shape and/or a wave shape.

Meanwhile, the display sheet constituting a flexible display device according to the present invention is provided for implementing an Organic Light Emitting Diode (OLED); however, it is not limited thereto.

Figure 3:
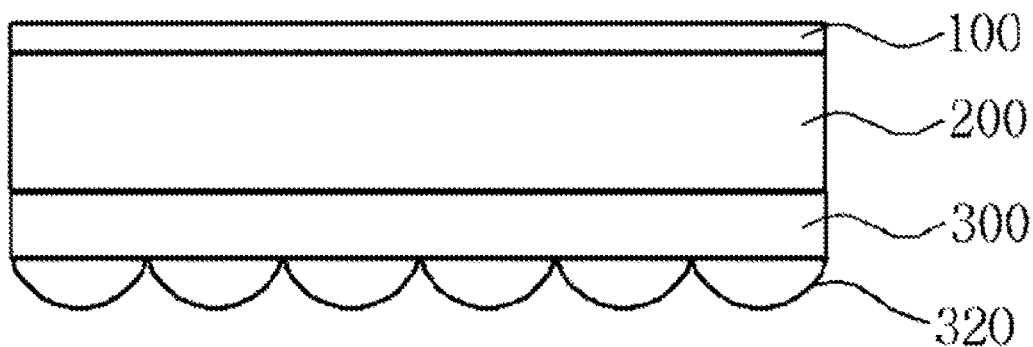
FIG. 3 is a cross-sectional view showing a stack structure of a flexible display device according to a second embodiment of the present invention.

FIG. 1 is a cross-sectional view showing a stack structure of a flexible display device according to a first embodiment of the present invention, and FIG. 3 is a cross-sectional view showing a stack structure of a flexible display device according to a second embodiment of the present invention.

Referring to FIGS. 1 and 3, a flexible display device according to the present invention basically includes a display sheet 200, a base film 300 and structural patterns 310, 320. In the present invention the display sheet 200 may be an OLED sheet and a touch screen panel 100 may be further provided on the display sheet 200.

The display sheet 200 is formed on the base film 300.

The display sheet 200 is preferable to be bonded on the base film 300. Here, an adhere layer (not shown) may be provided for bonding between the base film 300 and the display sheet 200, and the adhere layer (not shown) is formed between the base film 300 and the display sheet 200.

The display sheet 200 includes at least one organic light emitting film, and may include various configurations such as an electrode or a polarization plate.

The structural patterns 310, 320 are provided below the base film 300.

The structural patterns 310, 320 may be formed in such a way that heat or light-curable composition is applied on the base film 300 and then it is cured using heat or light while it is compressed with a mold patterned to have an inverse shape of the structural pattern. Meanwhile, several layers constituting the display sheet 200 may be arranged while confirming with the naked eye, if necessary, during a manufacturing process of the display sheet 200. Accordingly, when the base film 300 and the structural patterns 310, 320 are formed with a light transmitting material, it is advantageous that may confirm the above arrangement state at the bottom of the flexible display.

Figure 2:
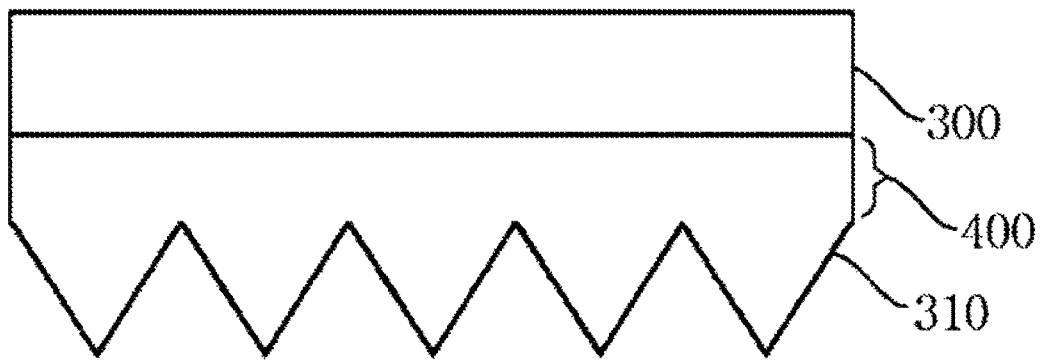
FIG. 2 is a cross-sectional view showing an example of a structural pattern containing a remaining layer of a stack structure of a flexible display device according to a first embodiment of the present invention.

Meanwhile, FIG. 1 illustrates a case where the valley a of each structural pattern is in contact with the base film 300; however, a remaining layer 400 having a predetermined thickness may be formed in the structural pattern 310 as shown in FIG. 2. When the remaining layer 400 is formed, the remaining layer 400 is preferable to be formed with the same material as the structural pattern 310.

The structural patterns 310, 320 formed below the base film 300 are provided for controlling the location of a neutral plane where the bending stress becomes zero. Since an organic layer, a bonding layer and an electrode have different rupture points, the damage degrees thereto due to the bending stress are different each other. According to the present invention since the structural patterns 310, 320 are formed below the display sheet 200 and thus the rupture point is relatively low, the neutral plane is moved to a layer that is ruptured easily by the bending stress. As a result, the possibility of the damage to the display sheet 200 becomes low.

FIG. 1 illustrates a case where a section of the structural pattern 310 is a triangle shape and FIG. 3 illustrates a case where a section of the structural pattern 320 is a semi-circle shape.

As such, the structural patterns 310, 320 according to the present invention may be formed in various shapes.

The structural patterns 310, 320 are types of a pattern that moves the neutral plane with respect to the bending stress to the layer having a relatively low rupture point for the bending stress among a plurality of layers constituting the flexible display device so that the bending stress applied to the layer having a relatively low rupture point is minimized.

As an example, when the bending moment is applied to a flexible display device, a tensile stress and a compressive stress corresponding to the bending stress are generated. The tensile stress is generated on one side of the section of the device and the compressive stress is generated on the opposite side thereof.

According to the present invention, the neutral plane where the bending stress is zero is moved to the layer having a relatively low rupture point among a plurality of layers constituting the display sheet 200, by forming the structural patterns 310, 320.

At this time, the neutral plane may be moved preferably to the layer having a minimum rupture point among a plurality of layers constituting the display sheet 200. The location to which the neutral plane is moved may be controlled by selecting the height, pitch, material of the structural pattern or the interval between the respective structural pattern.

Figure 4:
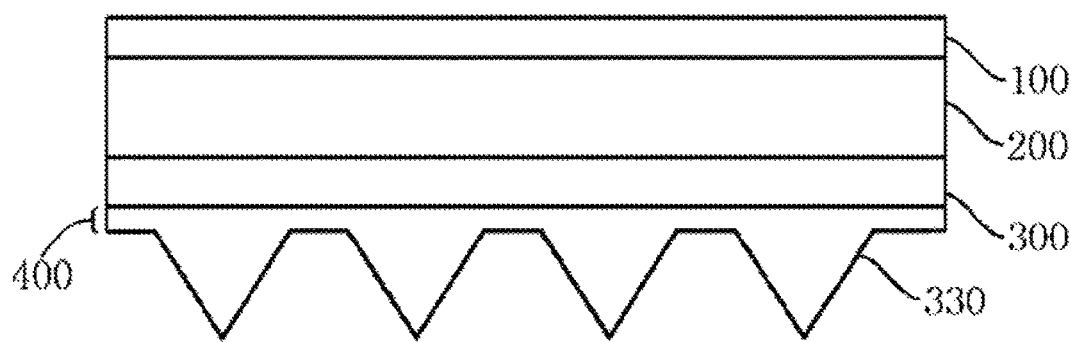
FIG. 4 is a cross-sectional view showing a stack structure of a flexible display device according to a third embodiment of the present invention.
Figure 5:
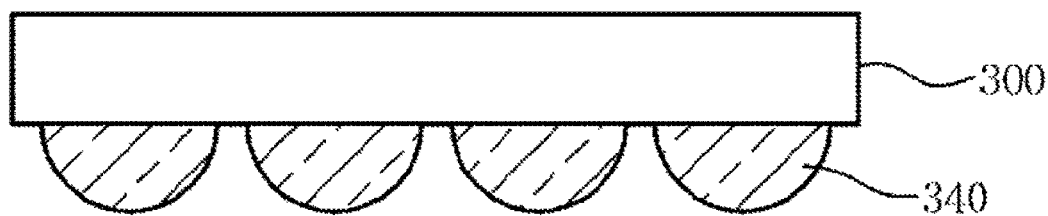
FIG. 5 is a cross-sectional view showing a base film structure of a flexible display device according to a fourth embodiment of the present invention.

FIGS. 1 and 3 illustrate an example where the structural patterns 310, 320 are formed adjacently each other; however, the structural patterns are not limited thereto and thus a plurality of the structural patterns may be formed to be spaced at a predetermined distance as shown in FIGS. 4 and 5.

FIG. 4 is a sectional view of a stack structure of a flexible display device according to a third embodiment of the present invention and FIG. 5 is a sectional view of a pattern for structuring 340 formed below the base film 300 in a flexible display device according to a fourth embodiment of the present invention.

FIG. 4 illustrates a case where a section of the structural pattern is a triangle shape and the respective pattern is spaced and FIG. 5 illustrates a case where a section of the pattern for structuring 340 is a semi-circle shape and the respective pattern is spaced.

In special, there arises a problem in the structure shown in FIG. 5 that the adjacent patterns are to be in contact each other thereby to inhibit the bending deformation when the bending deformation is produced in the flexible display device.

Eventually, when the structural patterns in semi-circle shapes are formed below the base film 300, a plurality of patterns may be implemented to be spaced more preferably.

Figure 6:
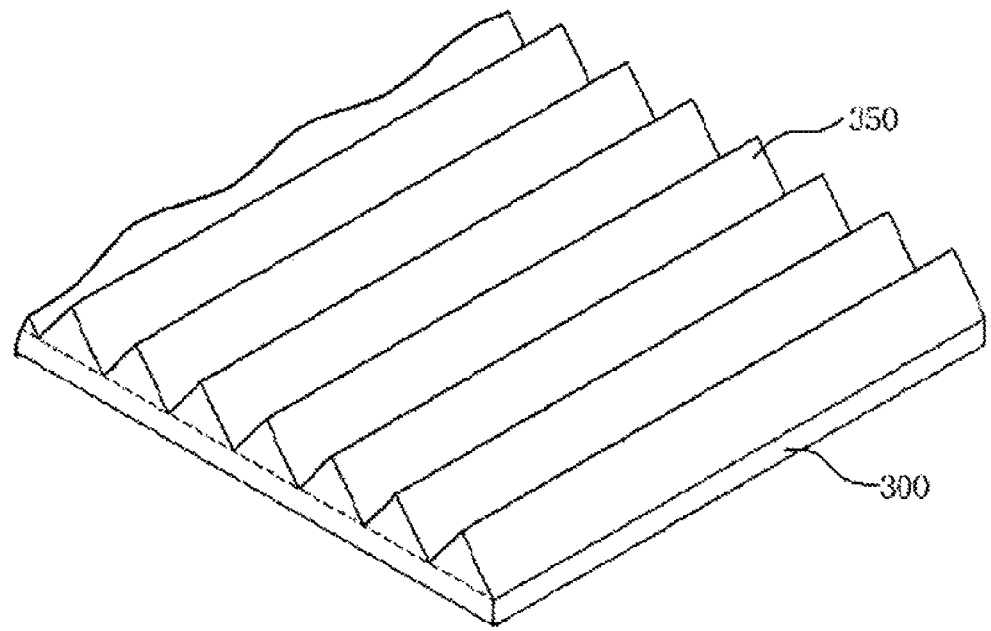
FIG. 6 is a perspective view showing an example of a structural pattern of a stack structure of a flexible display device according to a first embodiment of the present invention.

FIG. 6 is a perspective view of an example of a structural pattern of a stack structure of a flexible display device according to a first embodiment of the present invention and FIG. is a perspective view of another example of a structural pattern of a stack structure of a flexible display device according to a first embodiment of the present invention.

Figure 7:
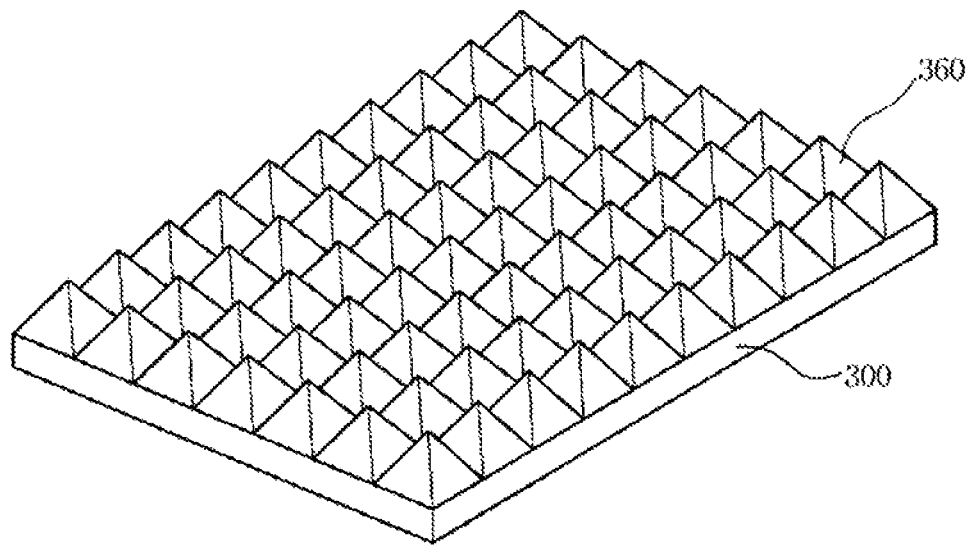
FIG. 7 is a perspective view showing another example of a structural pattern of a stack structure of a flexible display device according to a first embodiment of the present invention.

FIGS. 6 and 7 illustrate examples of three dimensional structure of the structural pattern 310 a section of which is a triangle shape wherein FIG. 6 illustrates a case where a plurality of the structural patterns 350 in prism shapes are formed on one surface of the base film 300 and FIG. 7 illustrates a case where a plurality of the structural patterns in pyramid shapes are formed on one surface of the base film 300.

Meanwhile, the plurality of structural patterns 350 of FIG. 6 may be arranged to be spaced and the plurality of structural patterns 360 of FIG. 7 may be arranged also to be spaced.

Figure 8:
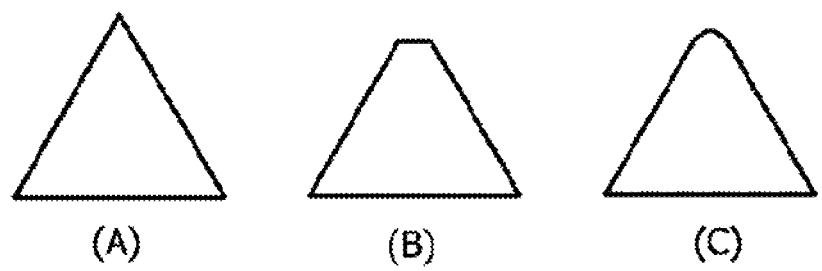
FIG. 8 is cross-sectional views showing a sectional shape of a structural pattern and examples of other variations thereof as shown in FIGS. 6 and 7.

FIG. 8 is a view illustrating the sections of the structural patterns shown in FIGS. 6 and 7 and the variation of the structural patterns.

Referring to FIG. 8, the sections of the structural patterns in a prism shape and a pyramid shape according to the present invention may be a triangle shape as shown in (A) of FIG. 8.

However, considering that the sectional shapes of a plurality of patterns are pointed and thus they may affect other constitutional element of a flexible display device, as shown (B) and (C) of FIG. 8, tops of the plurality of patterns may be cut or blunt preferably.

Figure 9:
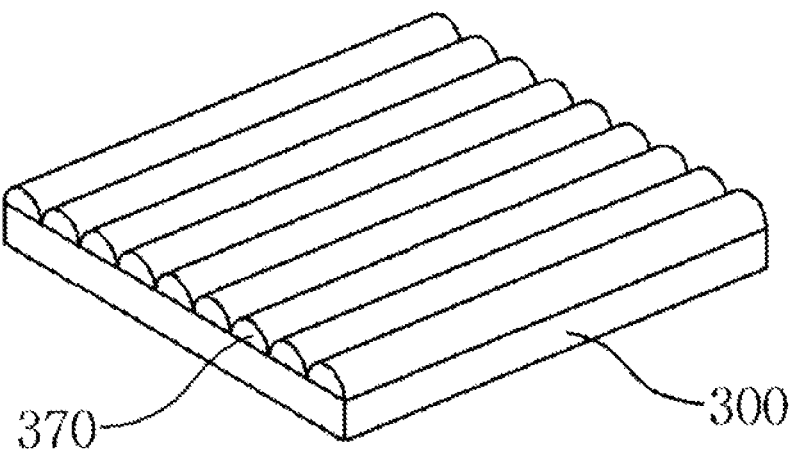
FIG. 9 is a perspective view showing an example of a structural pattern of a stack structure of a flexible display device according to a second embodiment of the present invention.
Figure 10:
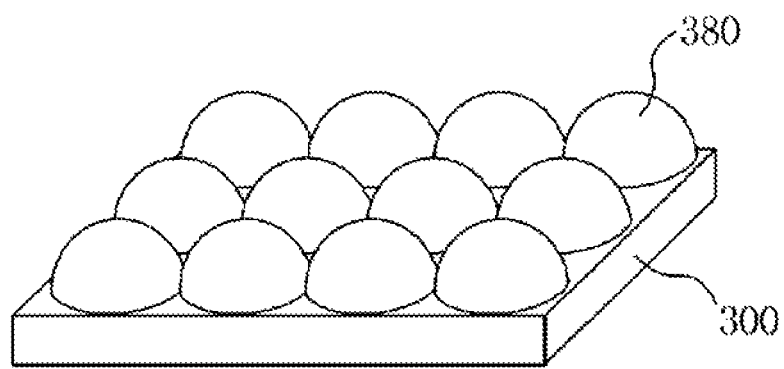
FIG. 10 is a perspective view showing another example of a structural pattern of a stack structure of a flexible display device according to a second embodiment of the present invention.

FIG. 9 is a perspective view of an example of a structural pattern of a stack structure in a flexible display device according to a second embodiment of the present invention and FIG. 10 is a perspective view of another example of a structural pattern of a stack structure in a flexible display device according to a second embodiment of the present invention.

FIGS. 9 and 10 illustrate examples of three dimensional structure of the structural pattern 320 a section of which is a semi-circle shape wherein FIG. 8 illustrates a case where a plurality of the structural patterns 370 in semi-circle column shapes are formed on one surface of the base film 300 and illustrates a case where a plurality of the structural patterns 380 in hemisphere shapes are formed on one surface of the base film 300.

Meanwhile, the plurality of structural patterns 370 of FIG. 9 may be arranged to be spaced and the plurality of structural patterns 380 of FIG. 10 may be arranged also to be spaced.

Figure 11:
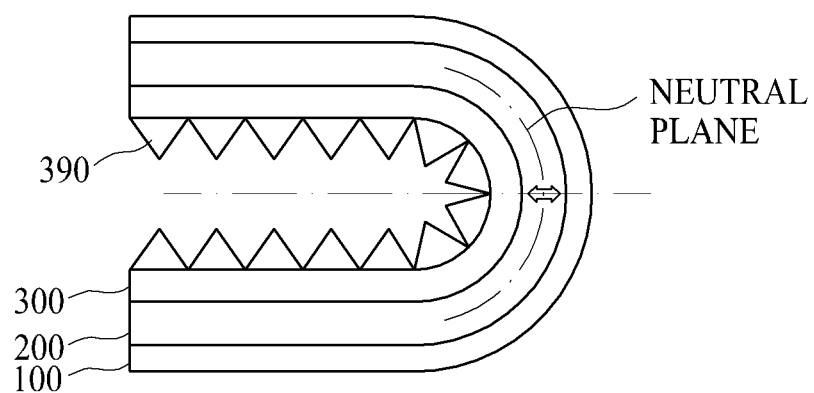
FIG. 11 is a cross-sectional view showing a neutral plane movement by a structural pattern according to the present invention.

FIG. 11 is a cross-sectional view of a neutral plane movement by a structural pattern according to an embodiment of the present invention and it shows that the neutral plane where the bending stress is zero is moved to a specific layer of the display sheet 200 by the structural pattern 390 a section of which is a triangle shape according to a first embodiment of the present invention.

According to the present invention, the neutral plane is moved to a layer having a relative low rupture point in a flexible display device by forming the patters for structuring so that the bending stress applying to the layer having a relative low rupture point can be minimized. As a result, the damage to the display device, which is caused from the deformation by the bending moment, can be prevented positively.

As a separate example, according to the present invention, a moving direction and a location of the neutral plane can be controlled by controlling the dimensions of height and width of the patterns when forming the patterns for structuring in various shapes.

While the present invention has been described with respect to the specific embodiments, it will be apparent to those skilled in the art that various changes and modifications may be made without departing from the spirit and scope of the invention as defined in the following claims.

The invention claimed is:
1. A flexible display device comprising:
    a base film having a first surface and a second surface opposite to the first surface;
    a display sheet formed on the first surface of the base film and including a plurality of layers which have different rupture points; and
    a structural pattern having
        a remaining layer formed on the second surface of the base film and
        a plurality of patterns protruded from the remaining layer and formed with same material as the remaining layer,
    wherein each of the plurality of patterns has a triangle-shaped cross-section,
    wherein the each of the plurality of patterns has a bottom formed on the remaining layer and spaced apart from a bottom of an adjacent pattern,
    wherein the plurality of patterns are arranged on the second surface such that a layer of the display sheet which has the lowest rupture point has no stress thereon when the display sheet is bent.
2. The flexible display device of claim 1, further comprising an adhering layer formed between the base film and the display sheet for bonding the base film and the display sheet.

* * * * *